(12) United States Patent
Chen et al.

(10) Patent No.: US 6,376,378 B1
(45) Date of Patent: Apr. 23, 2002

(54) POLISHING APPARATUS AND METHOD FOR FORMING AN INTEGRATED CIRCUIT

(75) Inventors: Feng Chen; Lup San Leong; Charles Lin, all of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/415,364

(22) Filed: Oct. 8, 1999

(51) Int. Cl.[7] .............................................. H01L 21/461
(52) U.S. Cl. ........................ 438/692; 438/691; 438/687
(58) Field of Search .................................. 438/692, 691, 438/687

(56) References Cited

U.S. PATENT DOCUMENTS

| | | | |
|---|---|---|---|
| 5,081,796 A | | 1/1992 | Schultz ..................... 51/165.74 |
| 5,216,843 A | | 6/1993 | Breivogel et al. .......... 51/131.1 |
| 5,435,772 A | * | 7/1995 | Yu ............................... 451/63 |
| 5,441,598 A | | 8/1995 | Yu et al. .................. 156/645.1 |
| 5,558,563 A | * | 9/1996 | Cote et al. ..................... 451/41 |
| 5,899,745 A | | 5/1999 | Kim et al. .................. 438/692 |
| 6,012,970 A | * | 1/2000 | Nagabushnam et al. ...... 451/41 |
| 6,093,651 A | * | 7/2000 | Andideh et al. ............. 438/692 |
| 6,123,609 A | * | 9/2000 | Satou .......................... 451/285 |

* cited by examiner

*Primary Examiner*—Trung Dang
(74) *Attorney, Agent, or Firm*—Wagner, Murabito & Hao LLP

(57) ABSTRACT

In one embodiment, a dielectric layer (144, 156) overlying a semiconductor substrate (28) is uniformly polished. During polishing, the perimeter (32) of the semiconductor substrate (28) overlies a peripheral region (16, 48, 66, 86, 120) of a polishing pad (6, 42, 60, 80, 100) and an edge portion (36) of the front surface of semiconductor substrate (28) is not in contact with the front surface (18, 50, 68, 88, 122) of the polishing pad (6, 42, 60, 80, 100), in the peripheral region (16, 48, 66, 86, 120). As a result, the polishing rate at the edge portion (36) of the semiconductor substrate (28) is reduced, and the semiconductor substrate (28) is polished with improved center to edge uniformity. Since the semiconductor substrate (28) is polished with improved center to edge uniformity, die yield is increased because die located within the edge portion (36) of the semiconductor substrate (28) are not over polished.

28 Claims, 17 Drawing Sheets

US 6,376,378 B1

POLISHING APPARATUS AND METHOD FOR FORMING AN INTEGRATED CIRCUIT

FIELD OF THE INVENTION

The present invention relates to integrated circuit fabrication, and more specifically to a polishing apparatus and to a method for polishing a layer of material in an integrated circuit.

BACKGROUND OF THE INVENTION

Polishing processes, and more specifically chemical-mechanical polishing processes, have been used in the semiconductor industry to prepare both single crystal substrates and silicon on insulator substrates. In addition, chemical-mechanical polishing processes have also been used to planarize various conductive and insulating layers subsequently deposited on these substrates, during the integrated circuit fabrication process. For example, chemical mechanical polishing has been used to planarize interlevel dielectric layers that lie in between two different levels of metal interconnect. Planarizing the interlevel dielectric layer, prior to the formation of the next level of interconnect, is highly desirable because it allows the next level of interconnect to be subsequently patterned and etched without the formation of conductive metal stringers, which can electrically short adjacent metal lines, and without the formation of thinned or notched metal lines, which can adversely effect device reliability. Similarly, chemical-mechanical polishing has been used to planarize conductive materials, such as tungsten, copper, and aluminum, to form planar contact plugs, via plugs, and interconnects. In addition, chemical-mechanical polishing has also been used to form trench isolation. In this process, trenches are formed and then subsequently filled with a deposited dielectric layer, such as silicon dioxide. The dielectric layer is then polished back to form dielectric filled isolation trenches, which are nearly planar with the adjacent active regions. In addition to being planar, the resulting trench isolation is also desirable because it allows the space separating adjacent active regions to be minimized and thus allows integrated circuits with high device packing densities to be fabricated.

Unfortunately, the conductive and dielectric layers formed on the semiconductor substrate during the integrated circuit fabrication process cannot be uniformly polished with current polishing equipment and polishing processes. One of the main reasons for this is that the polishing rate near the edge of the semiconductor substrate is often much higher than that near the center of the semiconductor substrate. Thus, portions of the conductive and dielectric layers which lie near the edge of the semiconductor substrate are often over-polished, and therefore semiconductor die located near the edge of the semiconductor substrate are lost. These die represent a substantial revenue loss to integrated circuit manufactures.

Accordingly, a need exists for a polishing process and polishing apparatus that can polish semiconductor substrates with improved center to edge uniformity.

BRIIEF DESCRIPTION OF THE DRAWINGS

The present invention may be more fully understood by a description of certain preferred embodiments in conjunction with the attached drawings in which.

DETAILED DESCRIPTION OF A PREFERRED EMBODIMENT

The present invention provides a polishing apparatus, and a method for uniformly polishing a layer of material in an integrated circuit therewith. The polishing apparatus comprises a polishing platen and a polishing pad having a central region and a peripheral region. The polishing pad overlies the polishing platen such that a portion of the front surface of the polishing pad in Lee peripheral region lies below the front surface of the polishing pad in the central region. During polishing, the perimeter of the semi conductor substrate overlies the peripheral region, and the ed,De of the semiconductor substrate is not in contact with the front surface of the polishing pad. As a result, the polishing rate at the edge of the semiconductor substrate is reduced, and the semiconductor substrate is polished with improved center to edge uniformity. Additionally, since the semiconductor substrate is polished with improved center to edge uniformity, die yield is increased because die located at the edge of the semiconductor substrate are not over polished.

Figure 1:
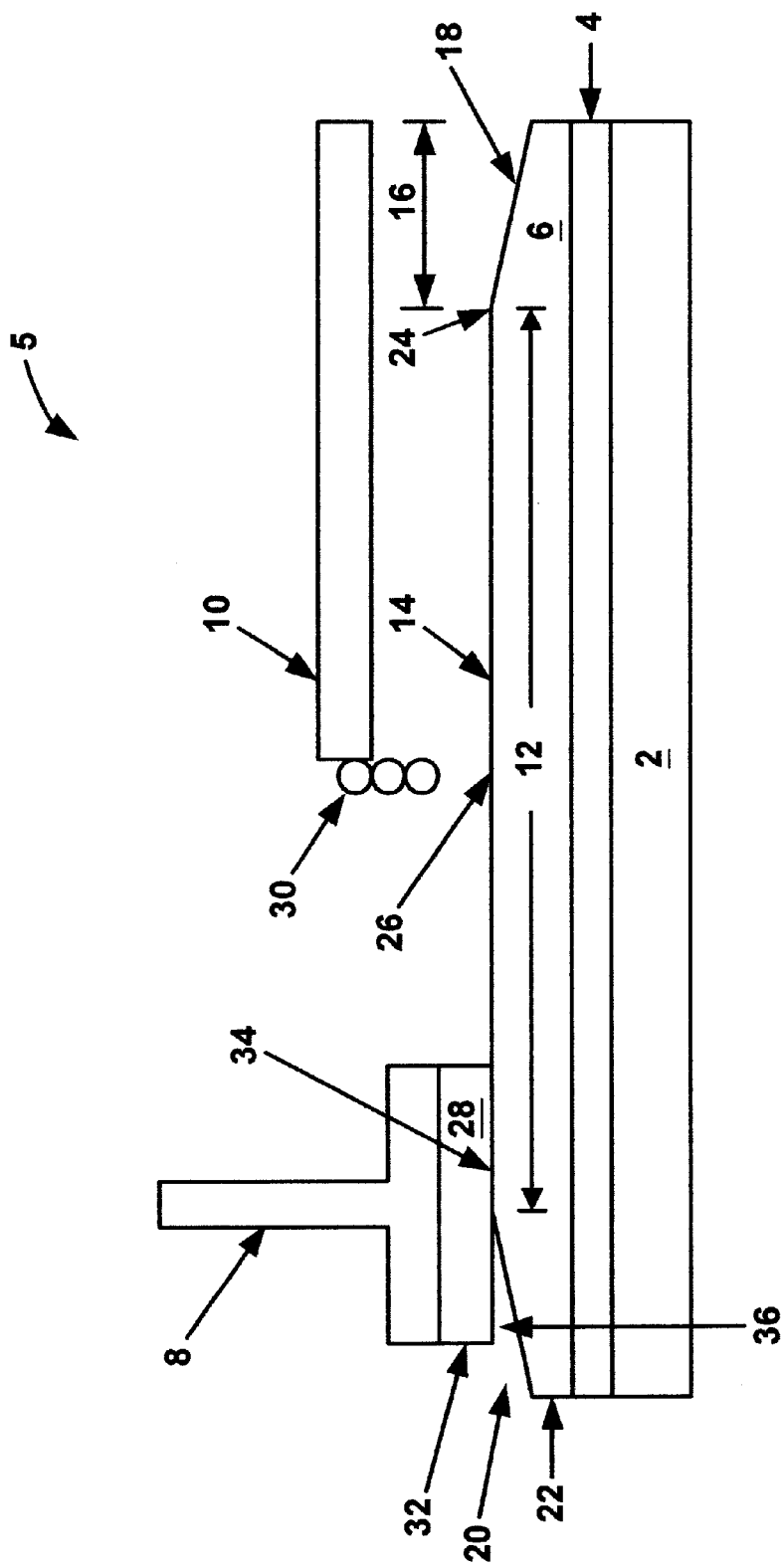
FIG. 1 illustrates, in cross-section, a polishing apparatus in accordance with one embodiment of the present intention

FIG. 1 illustrates, in cross section, a polishing apparatus 5 in accordance with one embodiment of the present invention. In this particular embodiment, polishing apparatus 5 comprises a polishing platen 2, an under pad 4, a polishing pad 6, a carrier 8, and a slurry dispenser 10. In an alternative embodiment, under pad 4 is not placed between polishing pad 6 and polishing platen 2. In one embodiment, under pad 4 is a felt based under pad comprising polyurethane. For example, under pad 4 may be a SUBA IV under pad which is commercially available from RODEL, Inc. Polishing pad 6 comprises a central region 12 having a front surface 14, and a peripheral region 16 having a front surface 18. Front surface 18 lies below front surface 14, as shown in FIG. 1. In this particular embodiment, peripheral region 16 comprises a tapered region 20 having a constant angle taper which starts at the perimeter 22 of polishing pad 6 and extends to a predetermined location 24 offset from the center 26 of polishing pad 6. It should be appreciated, that tapered region 20 may also be formed using a variable angle taper. In one embodiment, polishing pad 6 is made of a material comprising polyurethane. It should be appreciated that polishing pad 6 and under pad 4 may be formed as separate pads, or as composite pad.

In FIG. 1, a semiconductor substrate 28 is also shown mounted to carrier 8 of polishing apparatus 5. In one embodiment, semiconductor substrate 28 is rotated by carrier 8, mid polishing pad 6 is rotated by polishing platen 2 when semiconductor substrate 28 is polished. In addition, slurry dispenser 10 dispenses a slurry 30 onto polishing pad 6. Note, carrier 8 and polishing platen 2 may be rotated in either the same direction, or in opposite directions. In one embodiment, carrier 8 is also radially oscillated across polishing pad 6 during polishing, and thus the perimeter 32 of semi-conductor substrate 28 periodically overlies peripheral region 6 of polishing pad 6. Note, semiconductor substrate 28 is oscillated such that the center 34 of semiconductor substrate 28 is not allowed to overlie peripheral region 16 during polishing. Thus, during polishing an edge portion 36 of the front surface of semiconductor substrate 28 is periodically not in contact with polishing pad 6, as shown in FIG. 1. As a result, the polishing rate of edge portion 36 is reduced, and semiconductor substrate 28 is polished with improved center to edge uniformity. It is important to note that this improved polishing uniformity increases die yield because die near the edge of semiconductor substrate 28 are not over polished. It should also be appreciated that the amount of time that edge portion 36 spends over peripheral portion 16 is dependent upon the oscillation frequency of carrier 8. In an alternative embodiment, carrier 8 is not radially oscillated across the surface of polishing pad 6, and the perimeter 32 of semiconductor substrate 28 remains over peripheral portion 16 while semiconductor substrate 28 is polished.

Figure 2:
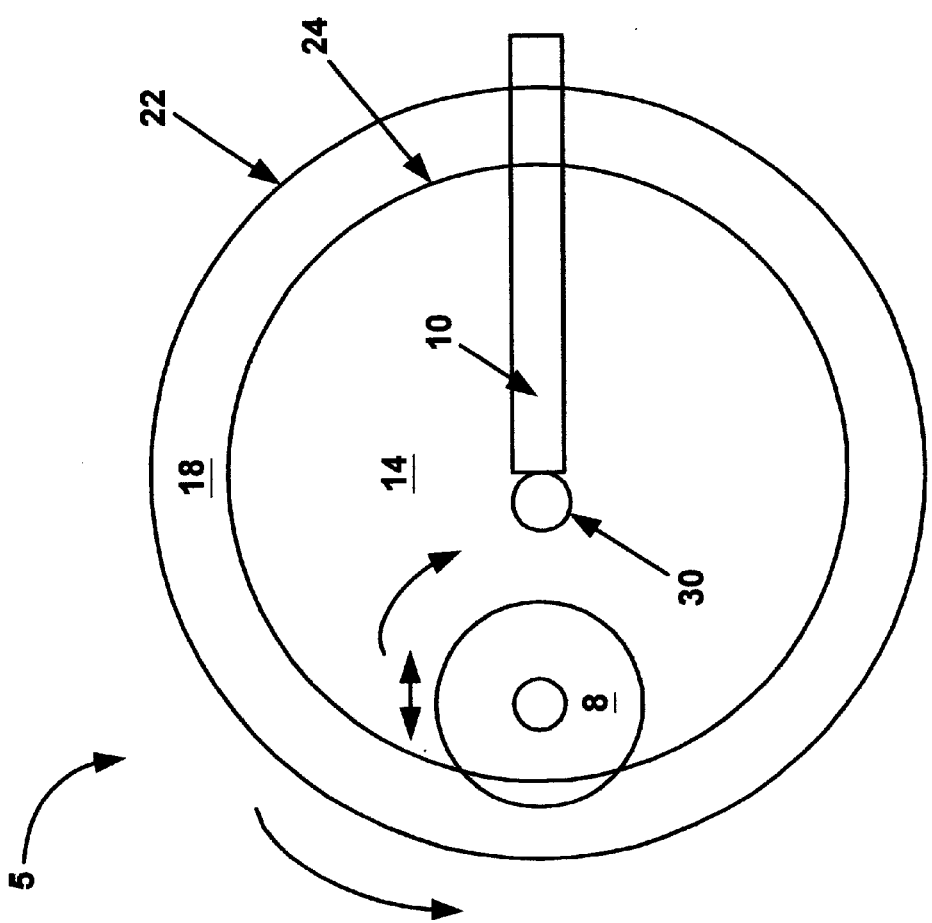
FIG. 2 illustrates, in plan view, the polishing apparatus of FIG. 1;.

FIG. 2 illustrates, in plan view, polishing apparatus 5 of FIG. 1. Note that, carrier 8 and polishing pad 6 are illustrated as being rotated in opposite directions, and carrier 8 is illustrated as being oscillated across polishing pad 6.

Figure 3:
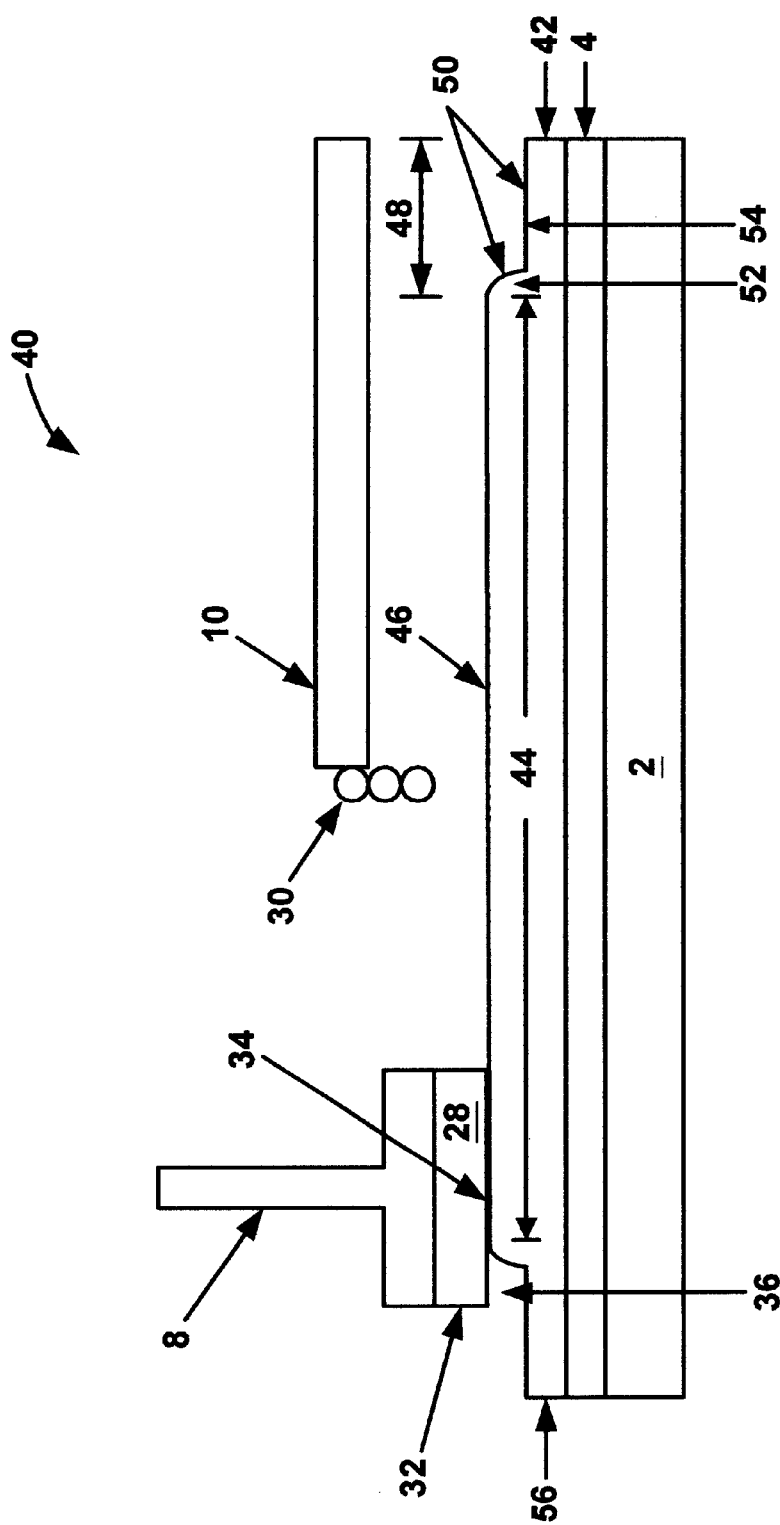
FIG. 3 illustrates, in cross-section, a polishes apparatus in accordance with another embodiment of the present invention.

FIG. 3 illustrates, in cross section, a polishing apparatus 40 in accordance with an alternative embodiment of the present invention. In this particular embodiment, polishing apparatus 40 comprises polishing platen 2, an under pad 4, a polishing pad 42, carrier 8, and slurry dispenser 10. In an alternative embodiment, tinder pad 4 is not placed between polishing platen 2 and polishing pad 42. Polishing pad 42 comprises a central region 44 having a front surface 46, and a peripheral region 48 having a front surface 50. Front surface 50 lies below front surface 46, as shown in FIG. 1. In this particular embodiment, peripheral region 48 comprises a tap ed region 52 having a variable angle taper, and a horizontal region 54 which extends from the perimeter 56 of polishing pad 42 to tapered region 52. It should be appreciated, that tapered region 52 may also be formed using a constant angle taper. In one embodiment, polishing pad 42 is made of a material comprising polyurethane. It should be appreciated that polishing pad 42 and under pad 4 may be formed as separate pads, or as a composite pad.

Figure 4:
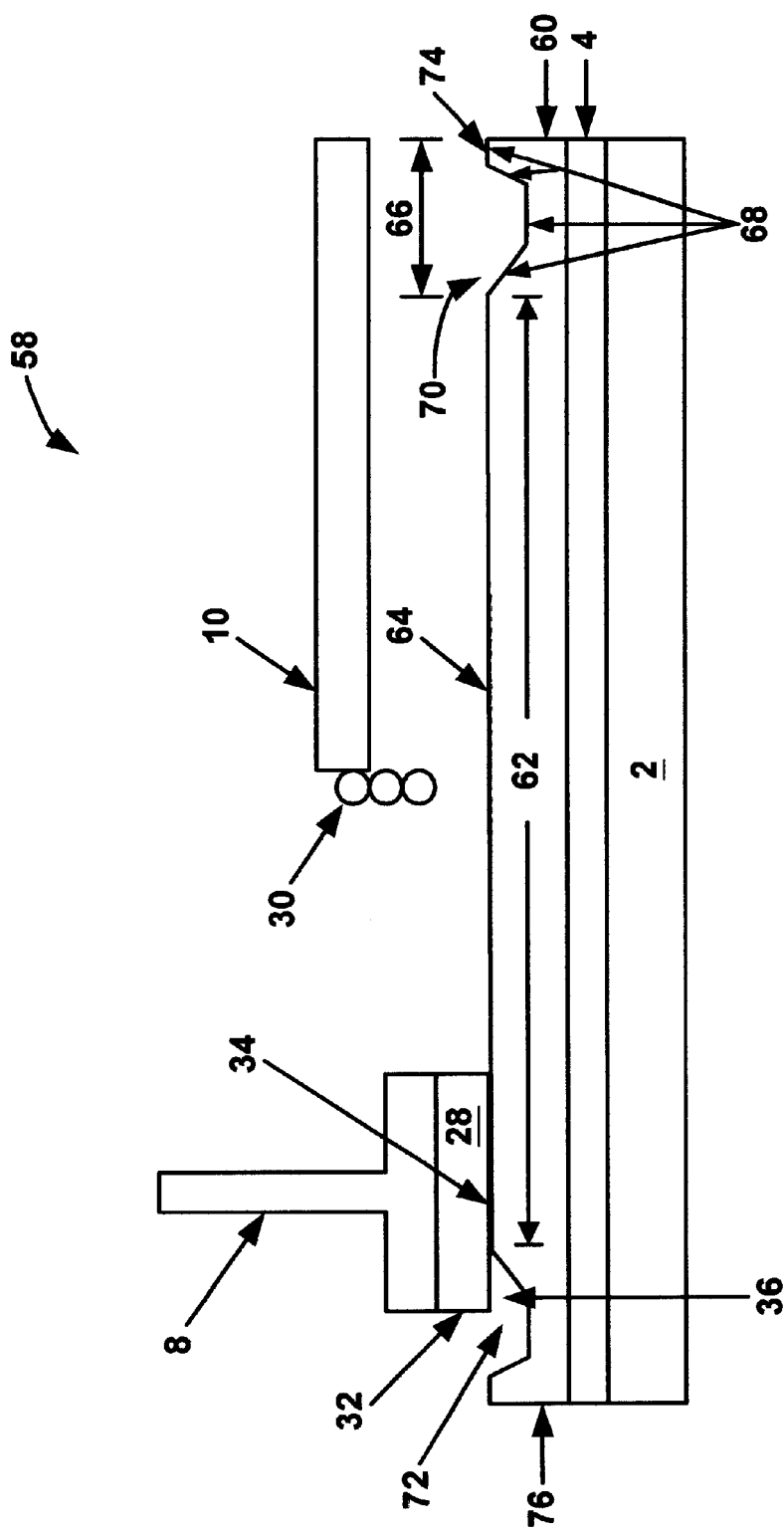
FIG. 4 illustrates, in cross-section, a polishing apparatus in accordance with another embodiment of the present invention.

FIG. 4 illustrates, in cross section, a polishing apparatus 58 in accordance with an alternative embodiment of the present invention. In this particular embodiment, polishing apparatus 58 comprises polishing platen 2, an under pad 4, a polishing pad 60, carrier 8, and slurry dispenser 10. In an alternative embodiment, under pad 4 is not placed between polishing platen 2 and polishing pad 60. Polishing pad 60 comprises a central region 62 having a front surface 64, and a peripheral region 66 having a front surface 68. A portion 70 of front surface 68 lies below front surface 64, as shown in FIG. 1. In this particular embodiment, peripheral region 66 comprises a grooved region 72 and a horizontal region 74. Horizontal re on 74 is substantially co-planar with central region 62, and extends from the perimeter 76 of polishing pad 60 to grooved region 72, as shown in FIG. 4. In this particular embodiment, grooved region 72 is formed using tapered sidewalls and a flat bottom. It should be appreciated, however, that grooved region 72 may be formed to have a variety of shapes. For example, it may be formed to have substantially vertical sidewalls and a flat bottom, such that it has a U-type shape, or formed with tapered sidewalls, but without a flat bottom, such that it has a V-type shape. Similarly, horizontal region 74 may also be formed to lie below front surface 64. In addition, polishing pad 60 may also be formed having horizontal holes formed within it (not shown), which extend from perimeter 76 to grooved region 72, so that slurry does not accumulate within grooved region 72 during polishing. In one embodiment, polishing pad 60 is made of a material comprising polyurethane. It should be appreciated that polishing pad 60 and under pad 4 may be formed as separate pads, or as a composite pad.

Figure 5:
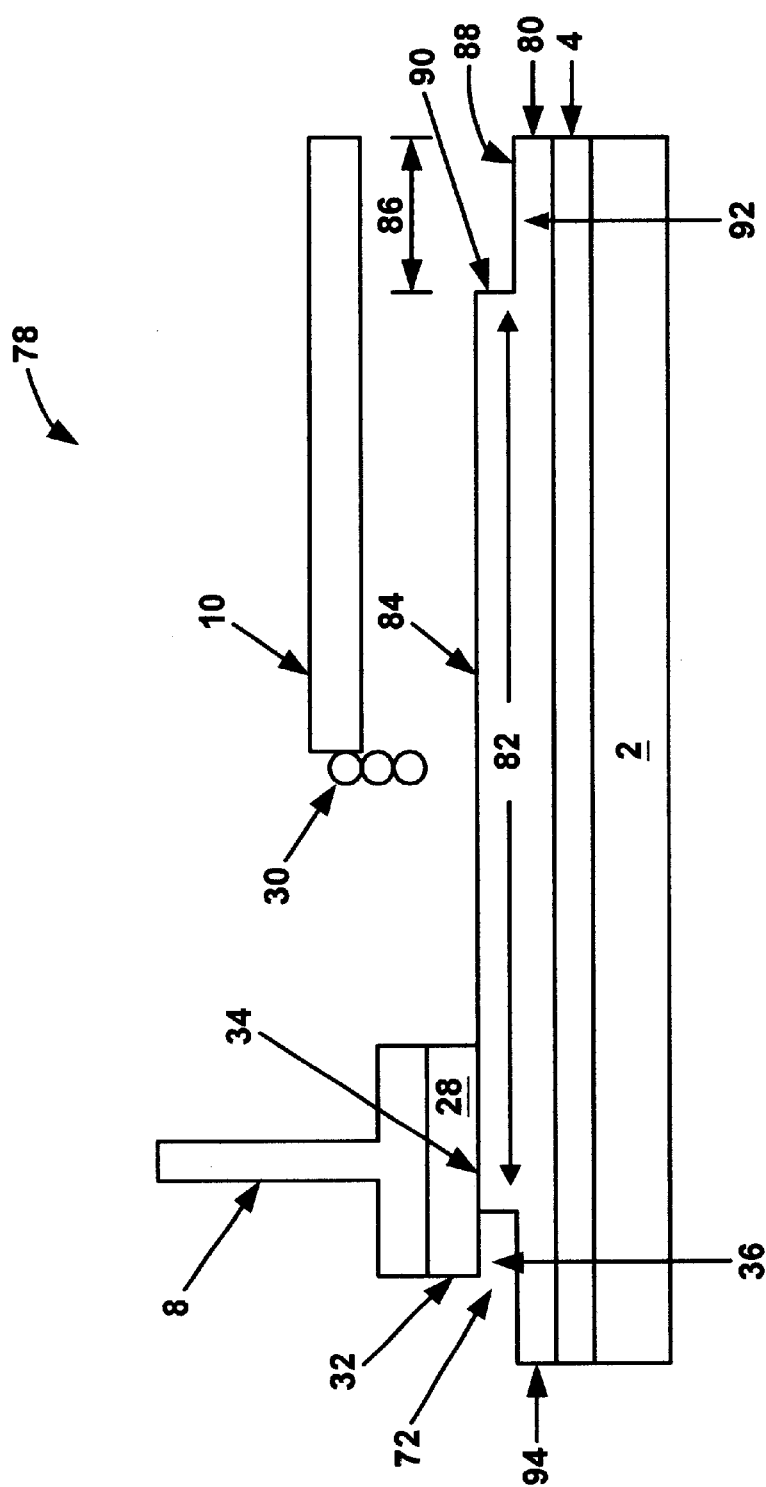
FIG. 5 illustrates, in cross-section, a polishing apparatus in accordance with another embodiment of the preset invention.

FIG. 5 illustrates, in cross section, a polishing apparatus 78 in accordance with an alternative embodiment of the present invention.

In this particular embodiment, polishing apparatus 78 comprises polishing platen 2, an under pad 4, a polishing pad 80, carrier 8, and slurry dispenser 10. In an alternative embodiment, under pad 4 is not placed between polishing platen 2 and polishing pad 80. Polishing pad 80 comprises a central region 82 having a front surface 84, and a peripheral region 86 having a front surface 88. Front surface 88 lies below front surface 84, as shown in FIG. 5. In this particular embodiment, peripheral region 86 comprises a substantially vertical sidewall 90 and a horizontal region 92, which extends from the perimeter 94 of polishing pad 80 to vertical sidewall 90. In one embodiment, polishing pad 80 is made of a material comprising polyurethane. It should be appreciated that polishing pad 80 and under pad 4 may be formed as separate pads, or as a composite pad.

Figure 6:
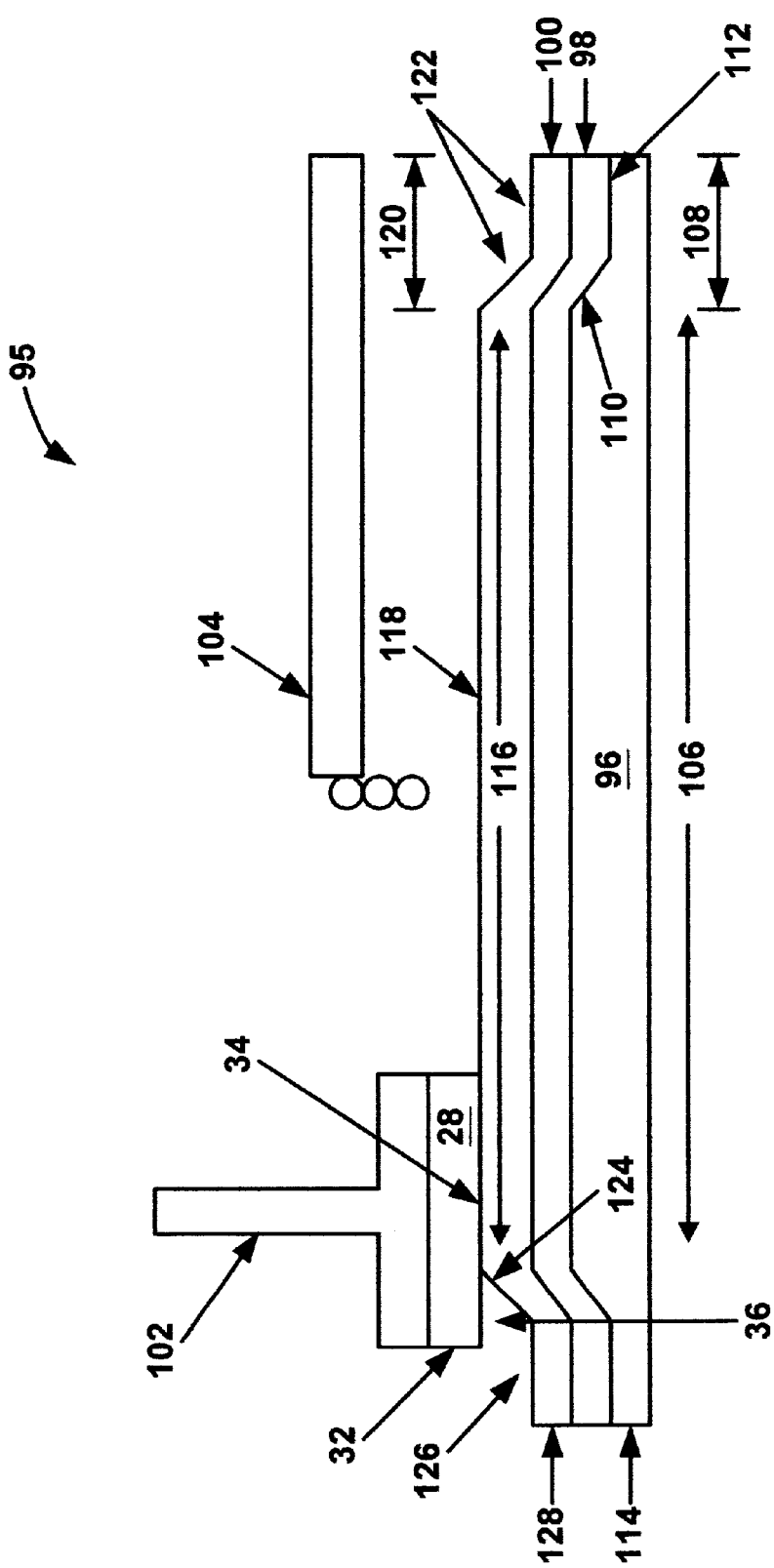
FIG. 6 illustrates, in cross-section, a polishing apparatus in accordance with an alternative embodiment of the present invention.

FIG. 6 illustrates, in cross section, a polishing apparatus 95 in accordance with an alternative embodiment of the present invention. In this particular embodiment, polishing apparatus 95 comprises a polishing platen 96, an under pad 98, a polishing pad 100, a carrier 102, and a slurry dispenser 104. In an alternative embodiment, under pad 98 is not placed between polishing platen 96 and polishing pad 100.

In this particular embodiment, polishing platen 96 comprises a comprises a central region 106 and a peripheral region 108, and peripheral region 108 lies below central region 106. In this particular embodiment, peripheral region 108 comprises a tapered region 110 and a horizontal region 112. Horizontal region 112 extends from the perimeter 114 of polishing platen 96 to taper region 110. It should be appreciated that tapered region 110 may be formed either as a variable angle taper or as a constant angle taper. In addition, it should also be appreciated that polishing platen 96 may also be formed without horizontal region 112, such that tapered region 110 starts at the perimeter 114 of polishing platen 96.

In one embodiment, under pad 98 is a felt based under pad comprising polyurethane. For example, under pad 98 may be a SUBA IV under pad which is commercially available from RODEL, Inc.

In one embodiment polishing pad 100 is made of a material comprising polyurethane. For example, polishing pad 100 may be a IC1000 polishing pad which is commercially available from RODEL, Inc. It is important to note that polishing pad 100 conforms to the underlying topography of polishing platen 96, and therefore polishing pad 100 comprises a central region 116 having a front surface 118, and a peripheral region 120 having a front surface 122. Front surface 122 lies below front surface 118, as shown in FIG.

6. In this particular embodiment, peripheral region 120 comprises a tapered region 124 and a horizontal region 126, which extends from the perimeter 128 of polishing pad 100 to tapered region 124. It should be appreciated, however, that if polishing platen 96 is formed without horizontal region 112, as previously discussed, then tapered region 124 would start at the perimeter 128 of polishing pad 100. It should also be appreciated that polishing pad 100 and under pad 98 may be formed as separate pads, or as a composite pad.

Figure 7:
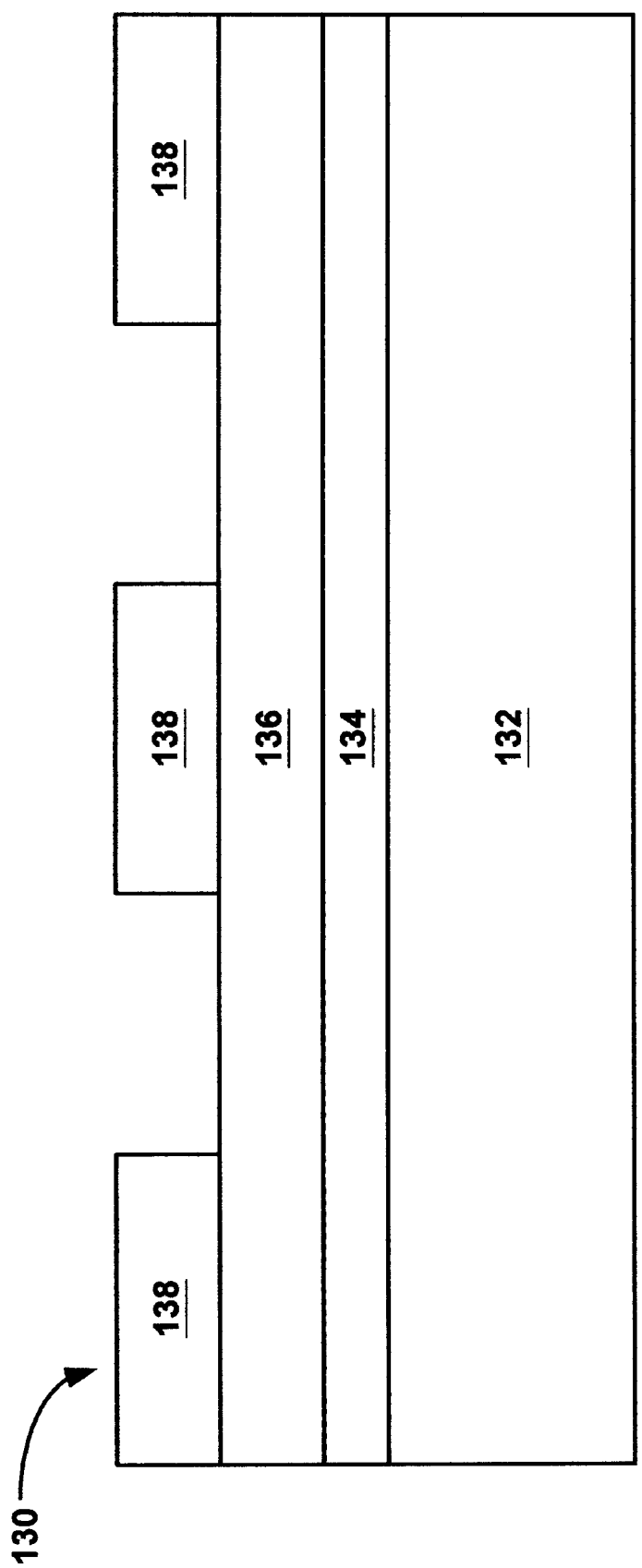
FIGS. 7–10 illustrate, in cross-section, process steps in accordance with one embodiment of the present invention.

FIG. 7 through FIG. 10 illustrate, in cross-section, process steps in accordance with one embodiment of the present invention wherein a trench isolation structure is formed in an integrated circuit. Shown in FIG. 7, is a portion 130 of an integrated circuit structure comprising a semiconductor substrate 132, a buffer layer 134, a polish-stop layer 136, and a photoresist mask 138. Semiconductor substrate 132 is preferably a monocrystalline silicon substrate. Alternatively, semiconductor substrate 132 may be a silicon-on-insulator (SOI) substrate, a silicon-on-sapphire (SOS) substrate, a silicon-germanium substrate, or the like. Buffer layer 134 typically has a thickness ranging from 5 to 100 nanometers, and is preferably a thermal oxide layer which is formed by thermally oxidizing a portion of semiconductor substrate 132. Alternatively, buffer layer 134 may be a chemical vapor deposited silicon oxide layer. Following the formation of buffer layer 134, polish-stop layer 136 is formed over buffer layer 134. Polish-stop layer 136 typically has a thickness ranging from 50 to 200 nanometers, and is preferably a silicon nitride layer. Alternatively, polish-stop layer 136 may be a boronitride layer, a silicon oxynitride, or the like. Photoresist mask 138, which overlies a portion of polish-stop layer 136 is formed using standard photolithographic patterning processes.

Figure 8:
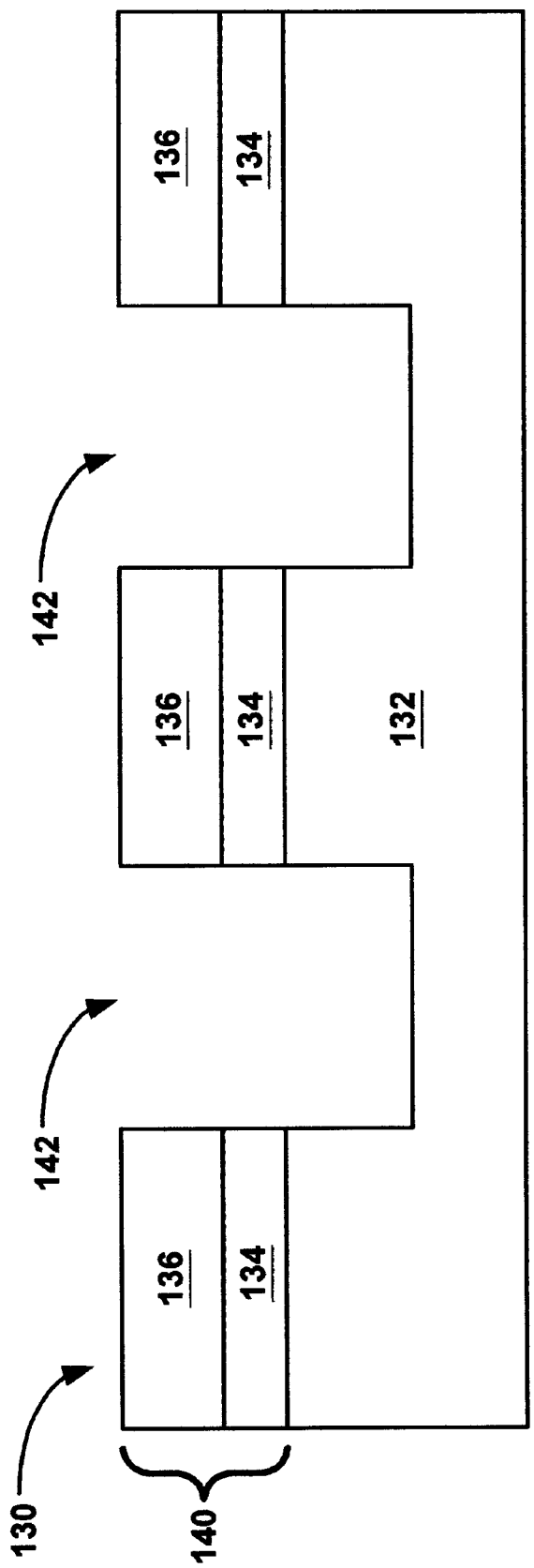

In FIG. 8, photoresist mask 138 is used to etch polish-stop layer 136 and underlying buffer layer 134, and form a patterned trench mask 140 that overlies a portion of semiconductor substrate 132. In addition, semiconductor substrate 132 is etched in regions not covered by patterned trench mask 140 to form trenches 142 in semiconductor substrate 132. Note, patterned trench mask 140 comprises a remaining portion of polish-stop layer 136 and a remaining portion of buffer layer 134. Trenches 142 and patterned trench mask 140 are formed using conventional etching techniques. It should be appreciated that photoresist mask 138 may be removed using conventional photoresist stripping techniques, either before or after trenches 142 have been formed.

Figure 9:
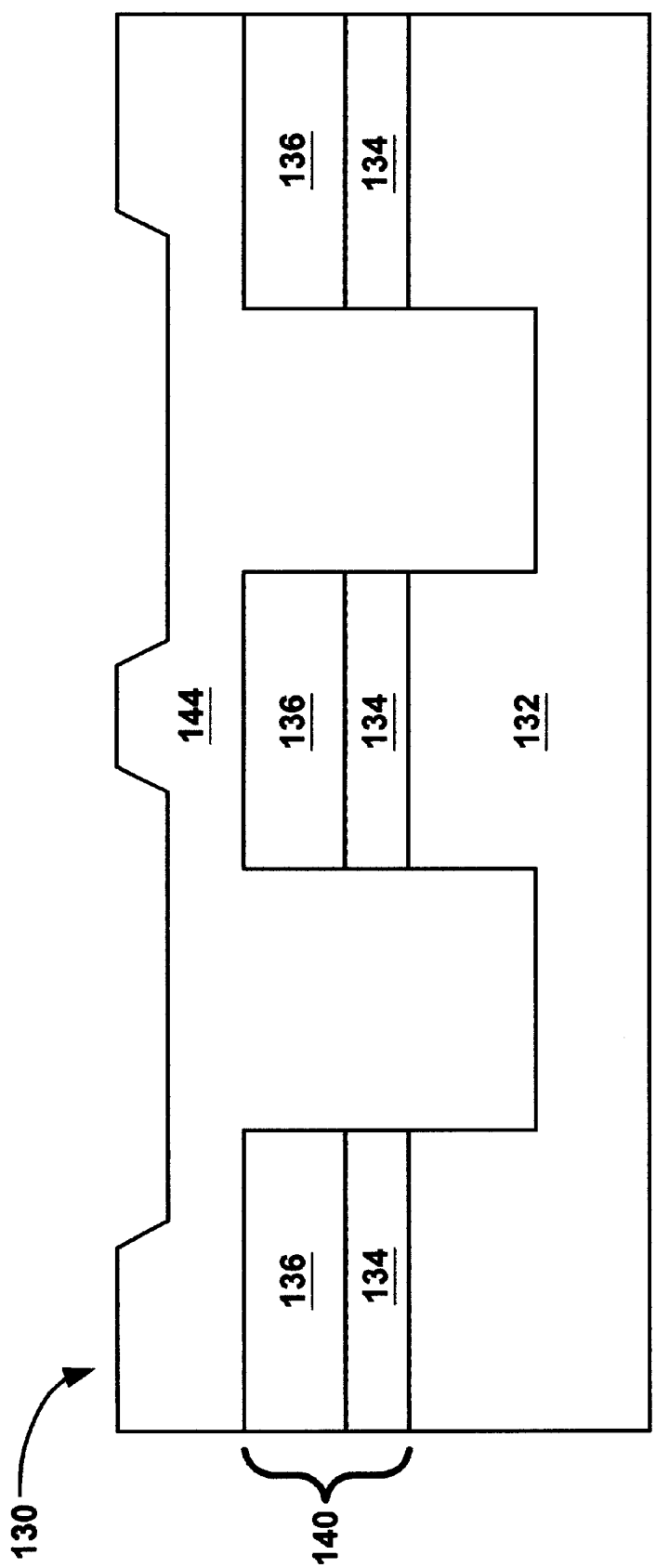

In FIG. 9, a dielectric layer 144 is then formed overlying semiconductor substrate 132. Dielectric layer 144 overlies pattern trench mask 140 and lies within trench 142, such that it substantially fills trenches 142. In a preferred embodiment, dielectric layer 144 is a layer of plasma oxide, which is formed using a commercially available high density plasma deposition system. In an alternative embodiment, dielectric layer 144 is a layer of chemically vapor deposited oxide, which is deposited using ozone and tetraethylorthosilicate (TEOS) as source gases. It should be appreciated that dielectric layer 144 may also be formed using other dielectric materials, such as germanium oxide, boro-phosphatesilicate-glass (BPSG), phosphate-silicate-glass (PSG), boro-silicate-glass (BSG), spin-on-glass, or the like, and that it may be may be formed using other techniques such, electron cyclotron resonance deposition, spin-on deposition, or the like. In addition, it should also be appreciated that a trench liner (not shown) may also be formed within trenches 142 prior to forming dielectric layer 144. For example, a portion of semiconductor substrate 132 may be thermally oxidized to form a thermal oxide layer along the sidewall and bottom of trenches 142 prior to depositing dielectric layer 144. Note, the trench liner will have a thickness which is insufficient to fill trenches 142.

Figure 10:
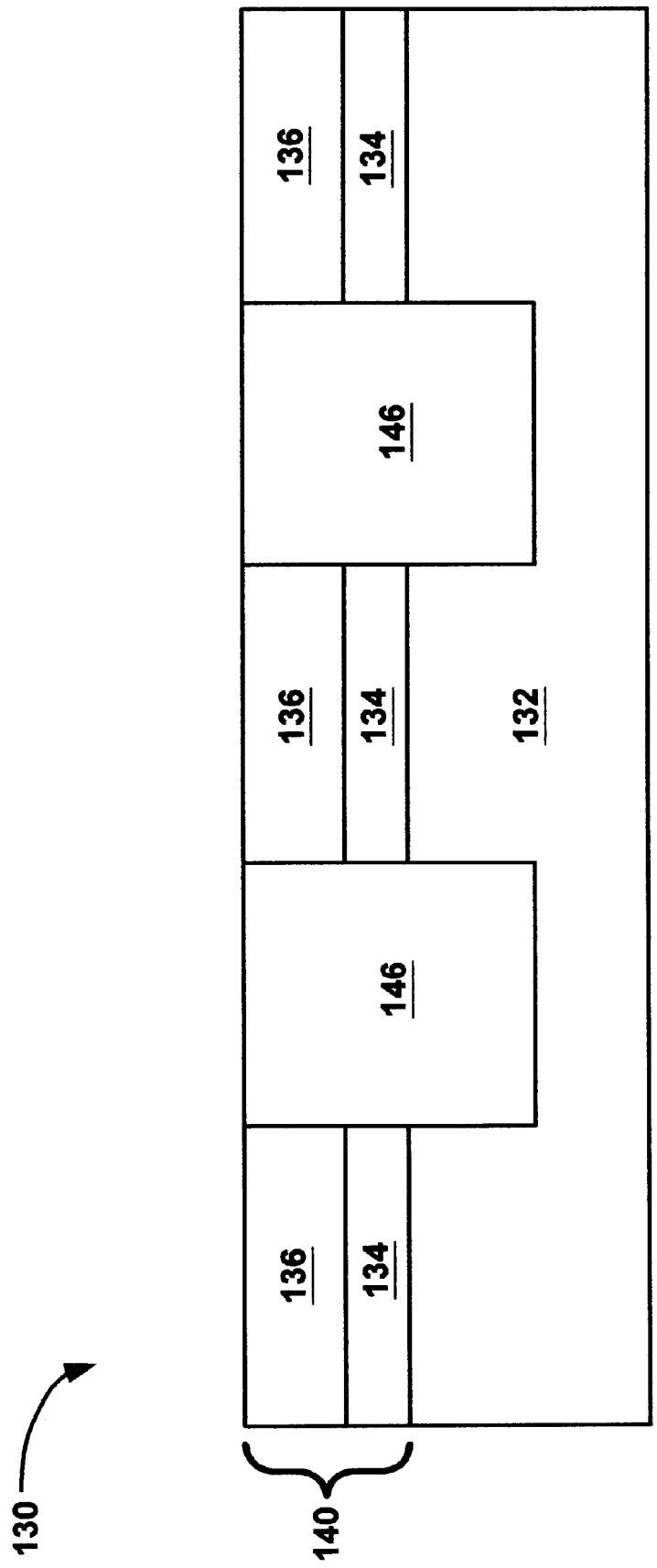

In FIG. 10, dielectric layer 144 is then uniformly polished, as described above in FIG. 1 through FIG. 6, to expose a portion of patterned trench mask 140, and leave a remaining portion 146 of dielectric layer 144 in trenches 142. In one embodiment, dielectric layer 144 is a layer of silicon oxide and is polished using a slurry comprising potassium hydroxide, deionized water, and a silica abrasive. Alternatively, dielectric layer 144 may be polished using a slurry comprising potassium hydroxide, deionized water, and an alumina abrasive, or using a slurry comprising ammonium hydroxide, deionized water, and a silica abrasive. After being exposed, patterned trench mask 140 is then subsequently removed to define active regions and trench isolation regions within semiconductor substrate 132 (not shown). Patterned trench mask 140 is removed using a wet or a dry etch process, or a combination thereof.

Figure 11:
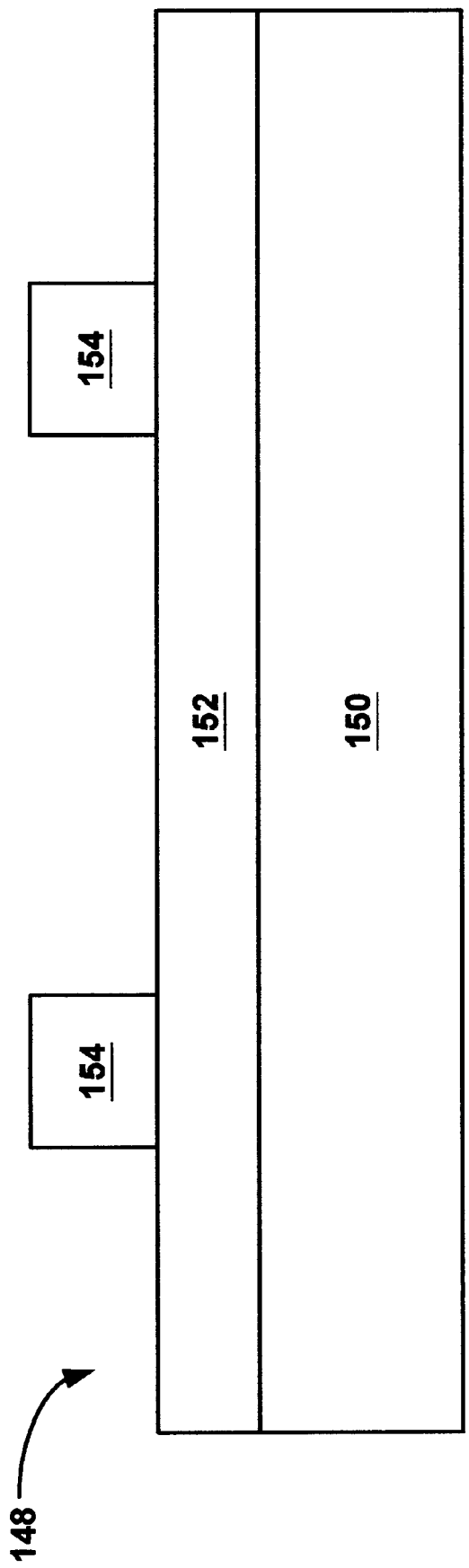
FIGS. 11–13 illustrate, in cross-section, process steps in accordance with another embodiment of the present invention.
Figure 12:
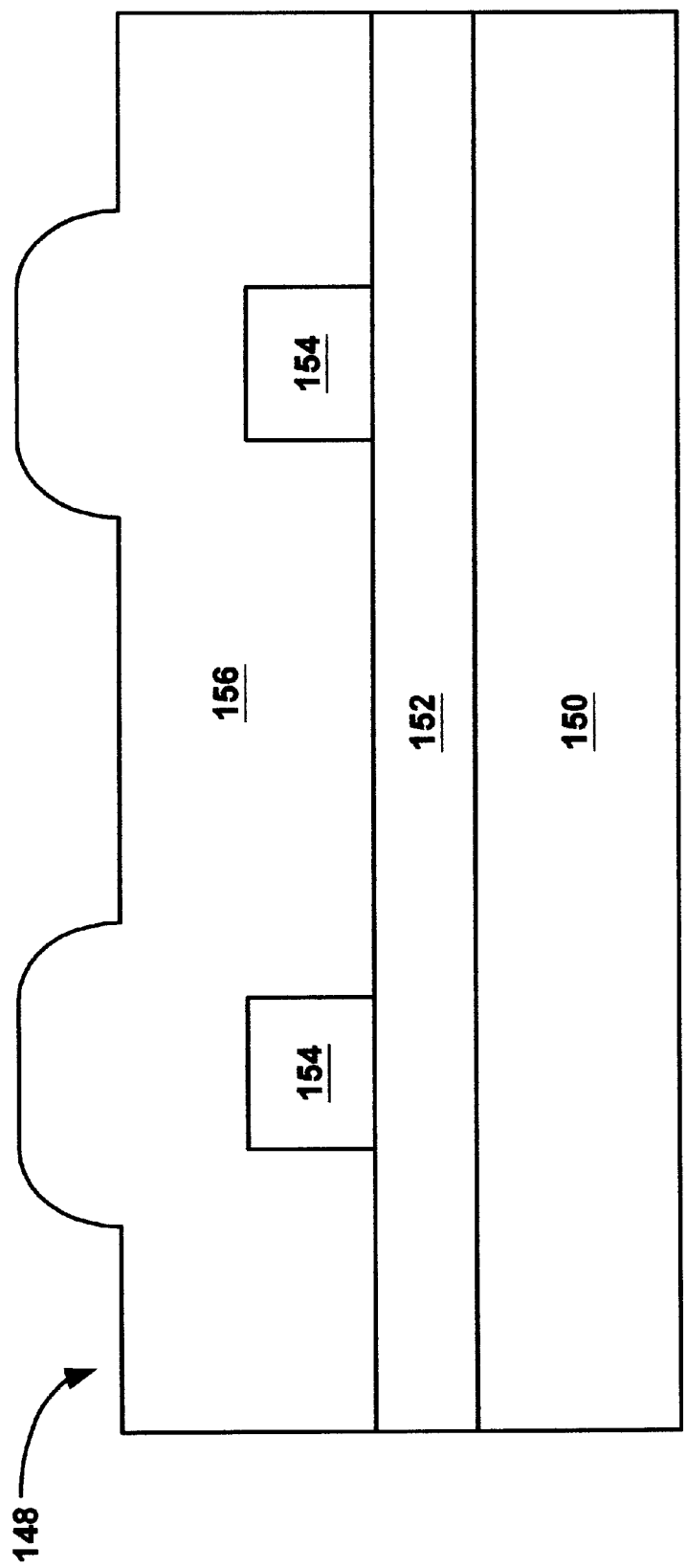
Figure 13:
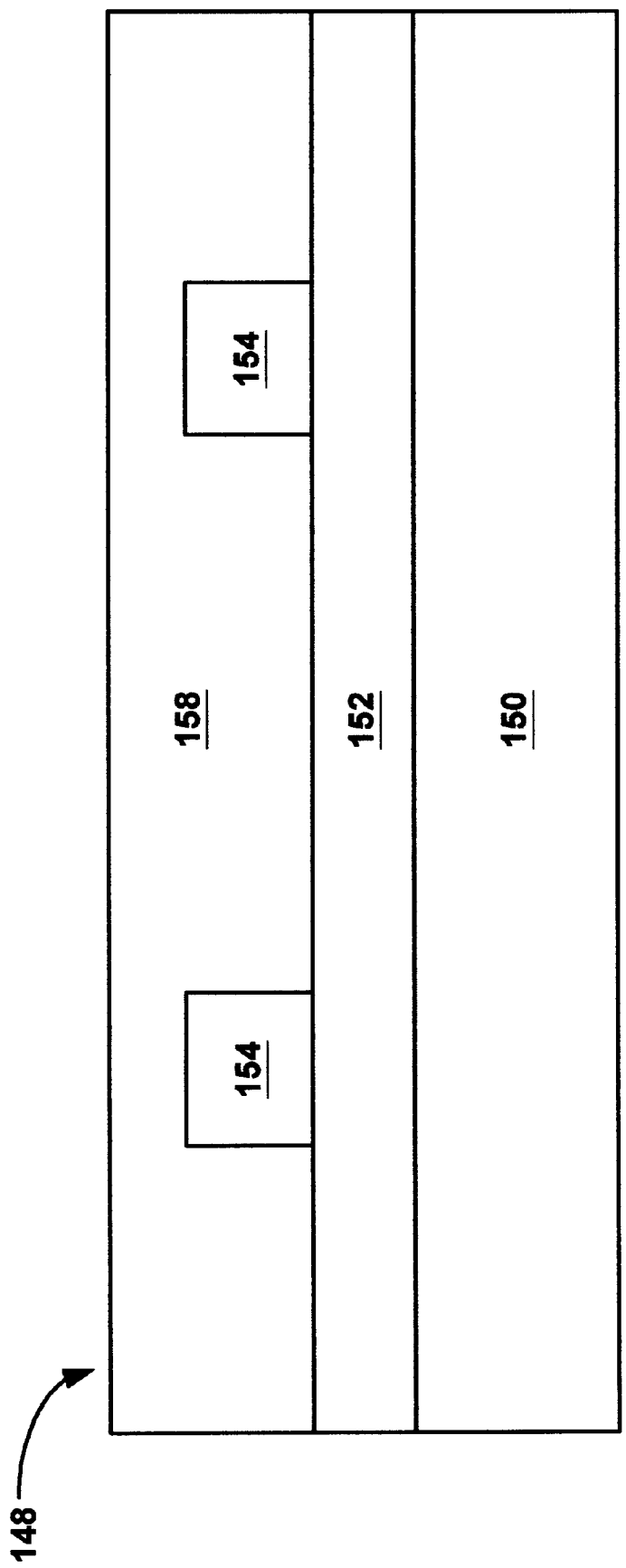

FIG. 11 through FIG. 13 illustrate, in cross-section, process steps in accordance with one embodiment of the present invention, wherein a planarized interlevel dielectric layer is formed in an integrated circuit. Shown in FIG. 11, is a portion 148 of an integrated circuit structure comprising a semiconductor substrate 150, a dielectric layer 152, and patterned conductive members 154. Semiconductor substrate 150 is similar to semiconductor substrate 132 of FIG. 7. In one embodiment, dielectric layer 152 is a gate dielectric layer. In alternative embodiment, dielectric layer 152 is an interlevel dielectric layer. If dielectric layer 152 is a gate dielectric layer, then semiconductor substrate 150 is preferably thermally oxidized to form dielectric layer 152. It should be appreciated, however, that other dielectric materials, such as silicon oxynitride or chemical vapor deposited silicon dioxide may also be used to form a gate dielectric layer. If dielectric layer 152 is an interlevel dielectric layer then dielectric layer 152 may be a layer of silicon dioxide, a layer of silicon nitride, a layer of boro-phosphate-silicate-glass (BPSG), a layer of phosphate-silicate-glass (PSG), a layer of spinon-glass (SOG), a silicon oxynitride layer, a polyimide layer, or the like. In addition, a combination of the foregoing dielectric materials may also be used to form dielectric layer 152. After dielectric layer 152 is formed, a conductive layer of material is formed overlying dielectric layer 152, and then patterned using conventional lithographic processes to form conductive members 154. Conductive members 154 may be formed using a doped polysilicon layer, a metal layer, a metal silicide layer, a metal nitride layer, or a combination thereof.

In FIG. 12, a dielectric layer 156 is then formed overlying semiconductor substrate 150. Dielectric layer 156 may be a layer of silicon dioxide, a layer of silicon nitride, a layer of boro-phosphatesilicate-glass (BPSG), a layer of phosphate-silicate-glass (PSG), a layer of spin-on-glass (SOG), a silicon oxynitride layer, a polyimide layer, or the like. In addition, a combination of the foregoing dielectric materials may also be used to form dielectric layer 156.

In FIG. 13, dielectric layer 156 is then uniformly polished, as described above in FIG. 1 through FIG. 6, to form a planarized interlevel dielectric layer 158. In one embodiment, dielectric layer 156 is a layer of silicon oxide and is polished using a slurry comprising potassium hydroxide, deionized water, and a silica abrasive. Alternatively, dielectric layer 156 may be polished using a slurry comprising potassium hydroxide, deionized water, and an alumina abrasive, or using a slurry comprising ammonium hydroxide, deionized water, and a silica abrasive.

Figure 14:
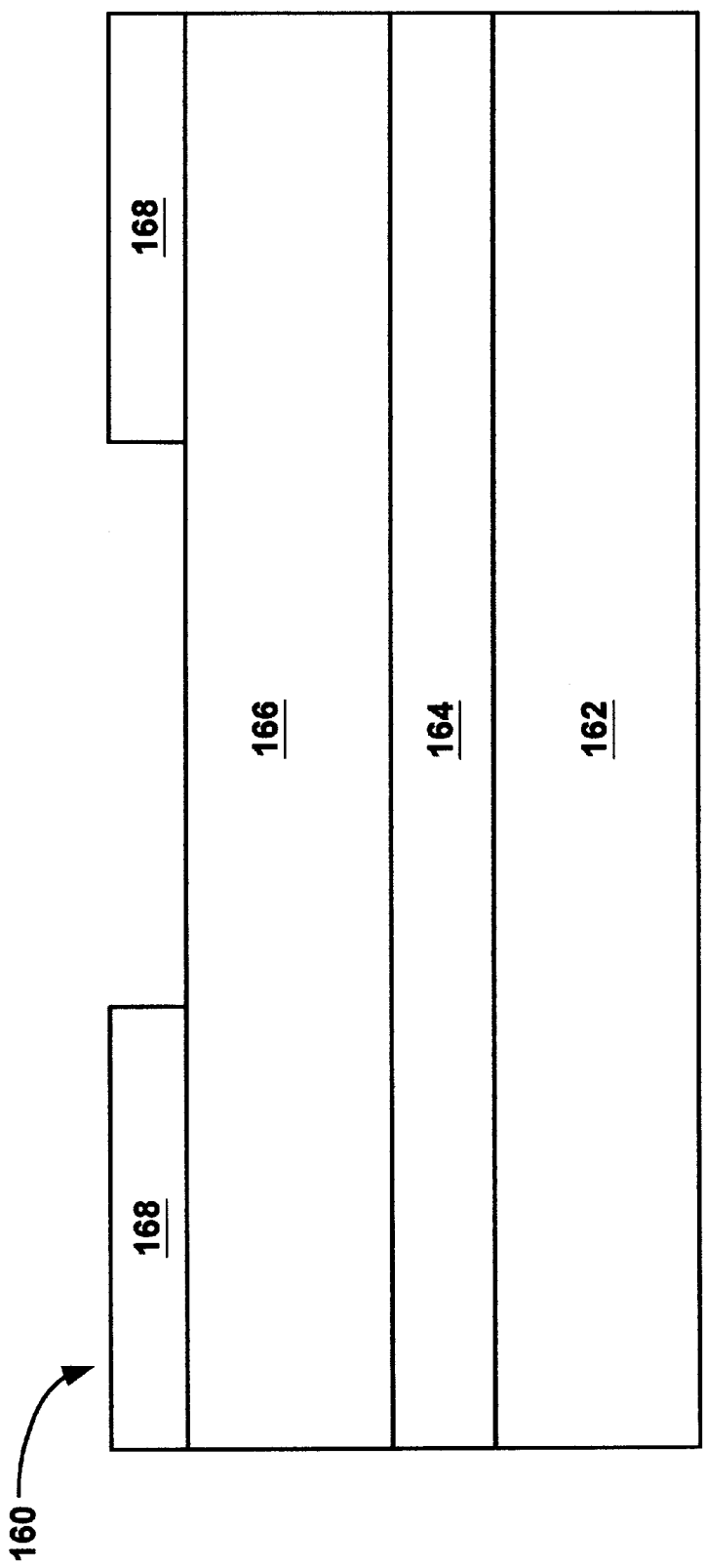
FIGS. 14–17 illustrate, in cross-section, process steps in accordance with another embodiment of the present invention.

FIG. 14 through FIG. 17 illustrate, in cross-section, process steps in accordance with one embodiment of the present invention, wherein a conductive member is formed in an integrated circuit. Shown in FIG. 14, is a portion 160 of an integrated circuit structure comprising a semiconductor substrate 162, a conductive region 164, and dielectric layer 166, and a photoresist mask 168. Semiconductor substrate 162 is similar to semiconductor substrate 132 of FIG. 7. In one embodiment conductive region 164 is a doped region which has been formed within a portion of semiconductor substrate 162. For example, it may be a doped source region, a doped drain region, a doped well contact, or the like. In an alternative embodiment, conductive region 164 is a patterned conductive member, such as a gate electrode, a contact plug, a via plug, an interconnect, or the like. Note, that if conductive region 164 is a gate electrode, a via plug, or an interconnect, then at least one dielectric layer (not shown) will lie between conductive region 164 and semiconductor substrate 162. Dielectric layer 166 may be a layer of silicon dioxide, a layer of silicon nitride, a layer of boro-phosphate-silicate-glass (BPSG), a layer of phosphate-silicate-glass (PSG), a layer of spin-on-glass (SOG), a silicon oxynitride layer, a polyimide layer, or the like. In addition, a combination of the foregoing dielectric materials may also be used to form dielectric layer 166. Photoresist mask 168, which overlies a portion of dielectric layer 166, is formed using standard photolithographic patterning processes.

Figure 15:
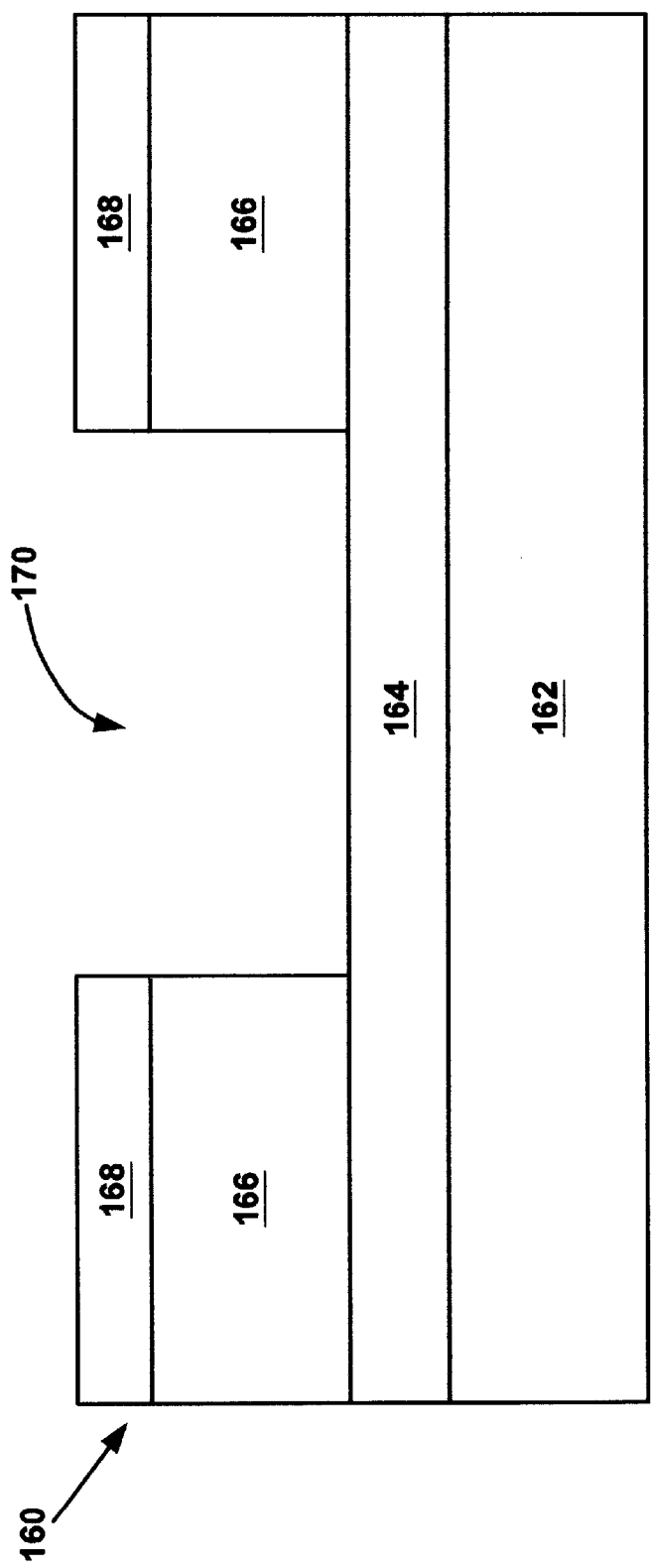

In FIG. 15, dielectric layer 166 is etched using photoresist mask 168 to form an opening 170 within dielectric layer 166. A portion of conductive region 164 is exposed within opening 170, as shown in FIG. 15. It should be appreciated that dielectric layer 166 may be etched using a wet or a dry etch process, or a combination thereof.

Figure 16:
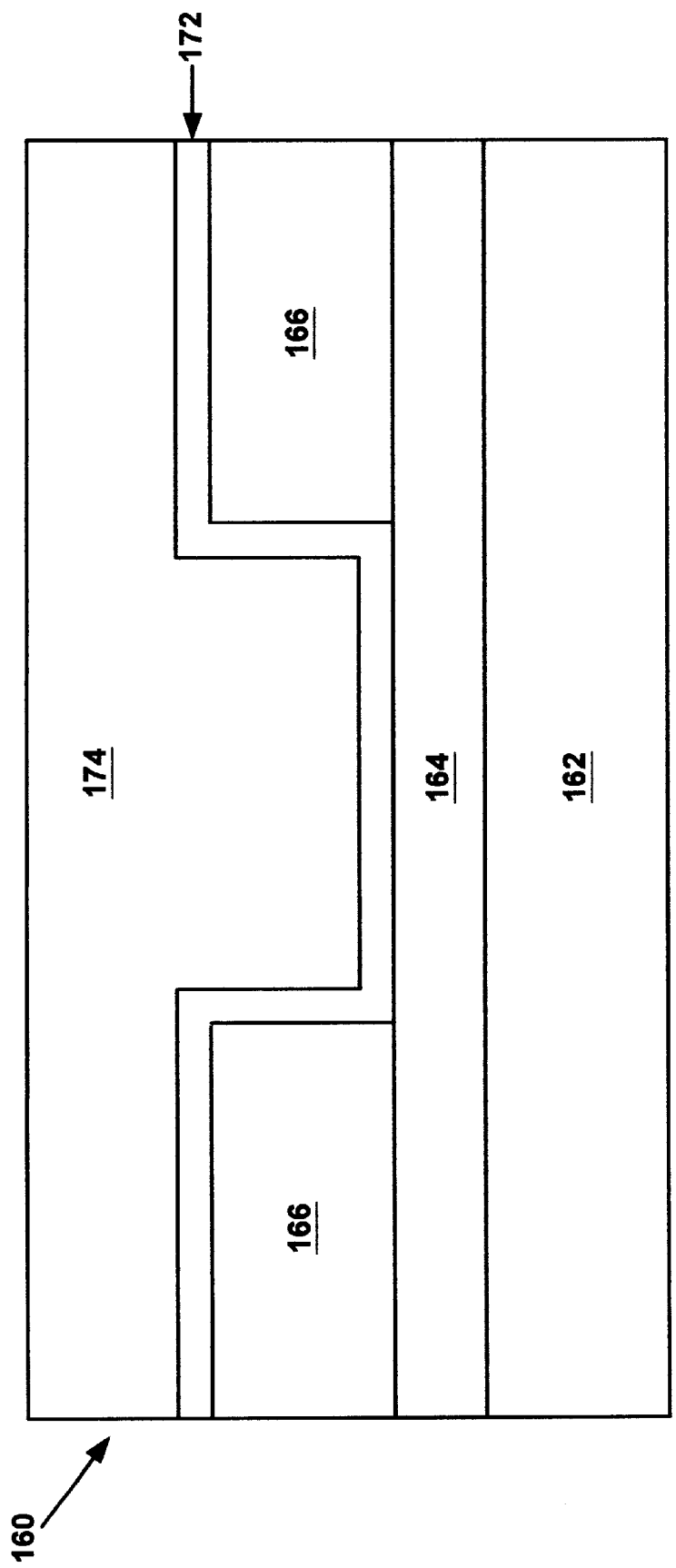

In FIG. 16, a barrier layer 172 is then formed overlying semiconductor substrate 162. Barrier layer 172 overlies dielectric layer 166 and lies within opening 170, such that it does not fill opening 170. A conductive layer 174 is then formed overlying barrier layer 172, such that opening 170 is substantially filled by conductive layer 174. Barrier layer 172 may be a metal nitride layer, such as titanium nitride, tantalum nitride, tungsten nitride, tantalum-silicon nitride, or the like, or a metal layer, such a layer of titanium, a layer of tantalum, a layer of tungsten, or the like, or a combination thereof. For example, barrier layer 172 may be a composite layer of titanium and titanium nitride. Conductive layer 174 may be an aluminum layer, an aluminum alloy layer, a copper layer, a tungsten layer, a doped polysilicon layer, or the like.

Figure 17:
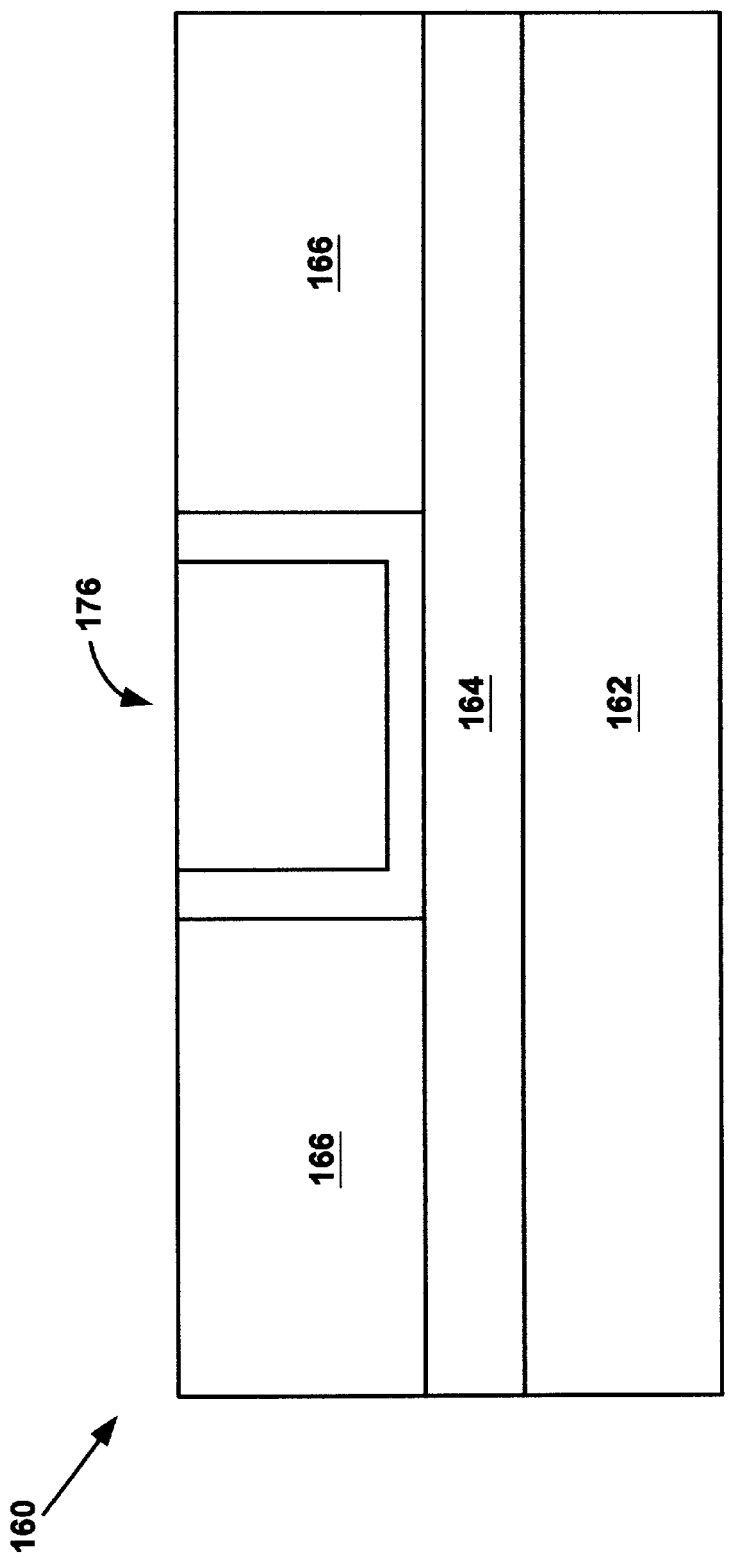

In FIG. 17, conductive layer 174 and barrier layer 172 are then uniformly polished, as described above in FIG. 1 through FIG. 6, to form a conductive member 176, such as a contact plug, a via plug, or an inlaid interconnect. In one embodiment, wherein conductive layer 174 is a tungsten layer and barrier layer 172 comprises titanium nitride, a slurry comprising ferric nitrate, deionized water, and a silica abrasive is used to form conductive member 176. Alternatively, tungsten and titanium nitride may also be polished using a slurry comprising hydrogen peroxide, deionized water, and a silica abrasive. In an alternative embodiment, wherein conductive layer 174 is a copper layer and barrier layer 172 comprises tantalum, a slurry comprising hydrogen peroxide, deionized water, and a silica abrasive is used to form conductive member 176.

Thus it is apparent that there has been provided, in accordance with the present invention, a polishing apparatus and a method for polishing a layer of material in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A method for forming an integrated circuit comprising the steps of: providing a semiconductor substrate having a perimeter; forming a layer of material overlying the semiconductor substrate, wherein the layer of material is further characterized as a copper layer; providing a polishing pad having a center and a perimeter, the polishing pad having a tapered region that extends from the perimeter of the polishing pad to a selected location offset from the center of the polishing pad; dispensing a slurry on the polishing pad; and polishing the layer of material, wherein during polishing the perimeter of the semiconductor substrate overlies the tapered region of the polishing pad for a selected period of time.

2. The method of claim 1, further comprising the step of moving the substrate radially across the polishing pad while polishing the layer of material.

3. The method of claim 1, wherein the polishing pad has a first thickness at the selected location and a second thickness at the perimeter, and wherein the second thickness is less than the first thickness.

4. The method of claim 1, wherein the slurry comprises hydrogen peroxide.

5. The method of claim 1, wherein the layer of material is further characterized as a tungsten layer.

6. The method of claim 5, further comprising the step of dispensing a slurry comprising ferric nitrate on the polishing pad.

7. The method of claim 1, wherein the layer of material is further characterized as a silicon oxide layer.

8. The method of claim 7, further comprising the step of dispensing a slurry comprising potassium hydroxide on the polishing pad.

9. The method of claim 1, wherein the tapered region is further characterized as having a constant angle taper.

10. The method of claim 1, wherein the tapered region is further characterized as having a variable angle taper.

11. A method for forming an integrated circuit comprising the steps of: providing a semiconductor substrate having a center and an edge region; forming a layer of material overlying the semiconductor substrate, wherein the layer of material is further characterized as a copper layer; providing a polishing pad having a central region, a perimeter, and a peripheral region lying between the perimeter and the central region; the central region having a first front surface and the peripheral region having a second front surface, wherein the second front surface lies below the first front surface; and polishing the layer of material, wherein during polishing only the edge region of the semiconductor substrate is allowed to overlie the second front surface.

12. The method of claim 11, further comprising the step of moving the substrate radially across the polishing pad while polishing the layer of material.

13. The method of claim 11, wherein the layer of material is further characterized as a tungsten layer.

14. The method of claim 11, wherein the layer of material is further characterized as a silicon oxide layer.

15. The method of claim 11, wherein the peripheral region comprises a horizontal region.

16. The method of claim 11, wherein the peripheral region comprises a tapered region.

17. The method of claim 11, wherein the peripheral region comprises a substantially vertical sidewall.

18. The method of claim 11, wherein the peripheral region comprises a grooved region.

19. The method of claim 11, further comprising the step of providing a polishing platen having a tapered region, wherein the peripheral region of the polishing pad conforms to the tapered region of the polishing platen.

20. A method for forming an integrated circuit comprising the steps of: providing a semiconductor substrate having a center and an edge region; forming a layer of material overlying the semiconductor substrate, wherein the layer of material is further characterized as a copper layer; providing a polishing pad having a central region, a perimeter, and a peripheral region lying between the perimeter and the central region; the central region having a first front surface and the peripheral region having a second front surface, wherein a portion of the second front surface lies below the first front surface; and polishing the layer of material, wherein during polishing only the edge region of the semiconductor substrate is allowed to overlie the portion of the second front surface.

21. The method of claim 20, further comprising the step of moving the substrate radially across the polishing pad while polishing the layer of material.

22. The method of claim 20, wherein the layer of material is further characterized as a tungsten layer.

23. The method of claim 20, wherein the layer of material is further characterized as a silicon oxide layer.

24. The method of claim 20, wherein the peripheral region comprises a horizontal region.

25. The method of claim 20, wherein the peripheral region comprises a tapered region.

26. The method of claim 20, wherein the peripheral region comprises a grooved region.

27. The method of claim 26, wherein the grooved region is further characterized as being U-shaped.

28. The method of claim 26, wherein the grooved region is further characterized as being V-shaped.

* * * * *